(12) United States Patent
Fäcke et al.

(10) Patent No.: US 8,329,773 B2
(45) Date of Patent: Dec. 11, 2012

(54) HOLOGRAPHIC MEDIA AND PHOTOPOLYMERS

(75) Inventors: Thomas Fäcke, Leverkusen (DE); Friedrich-Karl Bruder, Krefeld (DE); Marc-Stephan Weiser, Leverkusen (DE); Thomas Rölle, Leverkusen (DE); Dennis Hönel, Zülpich (DE)

(73) Assignee: Bayer MaterialScience AG, Leverkusen (DE)

( * ) Notice: Subject to any disclaimer, the term of this patent is extended or adjusted under 35 U.S.C. 154(b) by 172 days.

(21) Appl. No.: 12/706,248

(22) Filed: Feb. 16, 2010

(65) Prior Publication Data

US 2011/0065827 A1  Mar. 17, 2011

(30) Foreign Application Priority Data

Feb. 17, 2009  (EP) .................................... 09002180

(51) Int. Cl.
 *C08F 2/50* (2006.01)
 *G03F 7/033* (2006.01)
 *G03F 7/035* (2006.01)
 *G03F 7/027* (2006.01)
 *G03F 7/025* (2006.01)
 *G03F 7/004* (2006.01)

(52) U.S. Cl. .............. 522/97; 522/90; 522/96; 522/151; 522/152; 522/162; 522/164; 522/166; 522/170; 522/173; 522/174; 430/270.1; 430/280.1; 430/281.1; 430/269; 430/284.1; 430/286.1

(58) Field of Classification Search ............... 522/90, 522/97, 96, 151, 152, 173, 174, 162, 164, 522/166, 170; 430/269, 270.1, 280.1, 281.1, 430/284.1, 286.1
See application file for complete search history.

(56) References Cited

U.S. PATENT DOCUMENTS

| | | | |
|---|---|---|---|
| 4,383,826 A | 5/1983 | Butler et al. |
| 4,959,284 A | 9/1990 | Smothers et al. |
| 6,103,454 A | 8/2000 | Dhar et al. |
| 2010/0112458 A1 | 5/2010 | Knocke |

FOREIGN PATENT DOCUMENTS

| | | |
|---|---|---|
| EP | 0044352 A1 | 1/1982 |
| EP | 0223587 A1 | 5/1987 |
| EP | 0352774 A1 | 1/1990 |
| EP | 1635231 A2 | 3/2006 |
| EP | 1701213 A2 | 9/2006 |
| JP | 61-088201 A | 5/1986 |
| JP | 2004-118050 A | 4/2004 |
| JP | 2004-342537 A | 12/2004 |
| JP | 2005-194476 A | 7/2005 |
| JP | 2005-239925 A | 9/2005 |
| JP | 2006-243416 A | 9/2006 |
| WO | WO-2005/124456 A2 | 12/2005 |
| WO | WO-2005/124460 A1 | 12/2005 |
| WO | WO-2008/125200 A1 | 10/2008 |

OTHER PUBLICATIONS

Bukowska et al., "Kinetic Study of Addition of Some Carboxylic Acids to 1,2-Epoxy-3-Phenoxypropane", *Organic Process Research & Development*, vol. 3, pp. 432-436 (1999).

*Primary Examiner* — Sanza McClendon
(74) *Attorney, Agent, or Firm* — Connolly Bove Lodge & Hutz LLP

(57) ABSTRACT

The invention relates to holographic media containing specific photopolymers, a process for the production thereof, and unsaturated glycidyl ether acrylate urethanes as writing monomers which are suitable for the preparation of photopolymers.

9 Claims, 1 Drawing Sheet

HOLOGRAPHIC MEDIA AND PHOTOPOLYMERS

RELATED APPLICATIONS

This application claims benefit to European Patent Application No. 09002180.9, filed Feb. 17, 2009, which is incorporated herein by reference in its entirety for all useful purposes.

BACKGROUND OF THE INVENTION

The invention relates to holographic media containing specific photopolymers, a process for the production thereof, and unsaturated glycidyl ether acrylate urethanes as writing monomers which are suitable for the preparation of photopolymers.

Photopolymers—i.e. materials which polymerize by light—are very widely used, such as, for example, in the coating of generally flat substrates, such as paper and wood in the furniture, film, parquet or printing industry. Moreover, there are many further special applications. Classically used materials are esters of (meth)acrylic acid, polyester acrylates, epoxy acrylates and urethane acrylates. A fairly seldom described class of substances comprises the glycidyl ether acrylate urethanes. EP 44352 teaches, for example, about the use thereof in dental compound compositions containing alkylglycidyl ether methacrylate urethanes—and phenylglycidyl ether methacrylate urethanes. JP 118475 describes the production of plastics lenses based on halogenated methylphenyl glycidyl ether acrylate urethanes. The production of optical elements having polarizing properties is taught by JP 2006243416, in which nonpolymerizing liquid crystalline materials are combined with polymerizing unsaturated materials, such as esters of unsaturated acids with aliphatic polyols and amides of unsaturated acids with aliphatic polyamines, and the abovementioned polyester acrylates, epoxy acrylates and urethane acrylates. In an embodiment described, a phenylglycidyl ether acrylate urethane based on hexamethylene diisocyanate is used for this purpose. These formulations are liquid and must be polymerized with light immediately after application.

Specific photopolymers are suitable for the production of volume holograms, which are structured by means of exposure to coherent radiation sources, such as, for example, laser radiation. A three-dimensional structure forms in the photopolymers, which structure can be described in general by a regional change of the refractive index in the material. A hologram is therefore an object which contains a periodic, spatial modulation of the refractive index. The optical function which such a hologram performs, for example representing a three-dimensional image or being capable of being used as a diffractive optical element, depends on the specific exposure.

For the use of photopolymers as a carrier of holograms for optical applications in the visible range, colourless or only very faintly coloured materials having a high diffraction effect are as a rule required after the exposure. Since the beginning of holography, silver halide films, in particular those having high resolution, have been used for this purpose. Dichromate gelatin (DCG), dichromate salt-containing gelatin films or mixed forms of silver halide and DCG are also used. Both materials require a chemical aftertreatment for the formation of a hologram, which gives rise to additional costs for industrial processes and makes it necessary to handle chemical developer solutions. Moreover, wet chemical processes have the disadvantage of causing swelling under the action of the developer solutions. During the subsequent drying, shrinkage of the film occurs. This generally leads to colour shifts and irregularities in the hologram imaging, which is undesired. Although this wet chemical process can be realized technically, experience in the holographic industry has shown that high levels of waste due to the complexity and required precision of the process leads to unacceptable high costs.

Various approaches were adopted for replacing the above materials. U.S. Pat. No. 4,959,284 (Dupont) describes photopolymers which consist, inter alia, of a thermoplastic, such as polyvinyl acetate, cellulose acetobutyrate or polymethyl methacrylate-styrene-copolymers, soluble in organic solvents, a photoinitiator and at least one vinylcyclopropane derivative. Moreover, EP352774A1 (Dupont) describes other monomers containing vinyl groups, such as N-vinylpyrrolidone, phenoxyethyl acrylate and acrylates of triols, such as trimethylolpropane (TMPTA) and ethoxylated trimethylolpropane (TMPEOTA) or other acrylates or acrylamides.

Photopolymers which are contained not from thermoplastics but from crosslinked polymers have also been recently described: U.S. Pat. No. 6,103,454 (InPhase) describes a polyurethane matrix comprising polymerizable components, such as 4-chlorophenyl acrylate, 4-bromostyrene and vinyl-naphthalene. These formulations were developed for holographic data storage, a holographic application in which many holograms which are very weak holograms readable only by means of electronic detectors are written and read out. Holographic media based on such a material are not suitable for the production of holograms visible to the eye.

It was now an object to provide holographic media which develop at room temperature only under coherent radiation and do not require any thermal or chemical aftertreatment. Furthermore, it was the object to provide for this purpose polymerizable writing monomers which are particularly suitable for the preparation in such photopolymer compositions. It was important to find polymerizing writing monomers which can be particularly readily dissolved in the binder.

EMBODIMENTS OF THE INVENTION

An embodiment of the present invention is a photopolymer composition comprising a) an unsaturated glycidyl ether acrylate urethane of formula (1a), formula (1b), or mixtures thereof

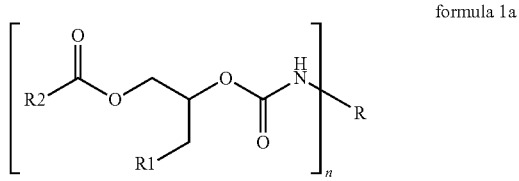

formula 1a

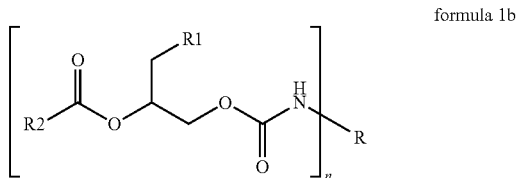

formula 1b wherein n is an integer from 2 to 6;

R1 is a mono- or polynuclear organic radical comprising an aromatic group and from 4 to 36 carbon atoms;

R2 is an olefinically unsaturated radical comprising from 3 to 30 carbon atoms; and R is an organic radical derived from an aliphatic or aromatic di- or polyisocyanate and comprises from 2 to 30 carbon atoms;

b) a binder system;
c) a photoinitiator system; and
d) optionally, a free radical stabilizer, a catalyst, and/or one or more further additives.

Another embodiment of the present invention is the above photopolymer composition, wherein R1 is oxyphenyl, oxybromophenyl, oxydibromophenyl, or oxynaphthyl;

R2 is derived from an acid R2-COOH, wherein R2-COOH is selected from the group consisting of acrylic acid, methacrylic acid, 3-acrylyloxypropionic acid, or an adduct of hydroxyethyl and hydroxybutyl acrylate with maleic anhydride; and R is derived from an n-functional isocyanate $R(NCO)_n$, wherein $R(NCO)_n$ is selected from the group consisting of 2,6-hexamethylene diisocyanate, 2,4,4-trimethyl-1,6-hexamethylene diisocyanate, isocyanatomethyl-1,8-octane diisocyanate, tris(p-isocyanatophenyl) thiophosphates, tris(4,4'- and/or 2,4'-) diisocyanatodicyclohexylmethane, 1-isocyanato-3-isocyanatomethyl-3,5,5-trimethylcyclohexane, diisocyanatodicyclohexylmethane 2,4- and/or 2,6-toluidene diisocyanate, and trimers of hexamethylene diisocyanate having an isocyanurate and/or iminooxadiazinetrione structure.

Another embodiment of the present invention is the above photopolymer composition, wherein said unsaturated glycidyl ether acrylate urethane of a) has a refractive index at 405 nm of greater than 1.53.

Another embodiment of the present invention is the above photopolymer composition, wherein said binders of b) are crosslinked.

Another embodiment of the present invention is the above photopolymer composition, wherein said crosslinked binder is a two-component polyurethane system.

Another embodiment of the present invention is the above photopolymer composition, wherein said two-component polyurethane system comprises, as the isocyanate component, oligo- and polyisocyanates of aliphatic diisocyanates comprising an isocyanurate, allophanate, biuret, uretdione, or iminooxadiazinedione structure, and the polyol component comprises polyethylene/polypropylene glycols having a polypropylene content of at least 70% and a functionality of from 1.9 to 2.5 and/or polyester-polyether-polyester block polyols based on polytetrahydrofurans having a number average molecular weight of from 400 to 1400 g/mol and ε-caprolactone, wherein said polyester-polyether-polyester block polyols have a number average molecular weight of from 1500 to 4000 g/mol.

Yet another embodiment of the present invention is a process for producing a medium for recording visual holograms, comprising applying the above photopolymer composition to a substrate or in a mould and curing said photopolymer composition.

Yet another embodiment of the present invention is a medium for recording visual holograms produced by the above process.

Yet another embodiment of the present invention is an optical element or image comprising the above medium.

Yet another embodiment of the present invention is a glycidyl ether acrylate urethane of formula (1a) or (1b)

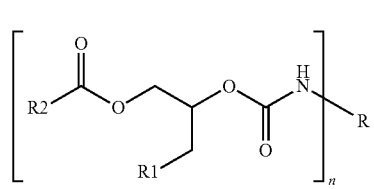

formula (1a)

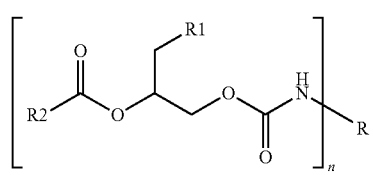

formula (1b)

wherein n is an integer from 2 to 6;

R1 is a halogen- and/or alkylthio-, and/or arylthio-substituted oxyphenyl ring or is a halogen-, alkyl-, aryl-, alkylthio-, or arylthio-substituted oxynaphthyl, oxyanthracenyl, oxyphenantryl, N-carbazolyl, N-alkylcarbazolzyl, N-phthalimidyl, N-phenothiazinyl, N-alkylphenothiazinyl, or oxytriarylmethyl radical, R2 is an olefinically unsaturated radical comprising from 2 to 30 carbon atoms;

R is an organic radical derived from an aliphatic or aromatic di- or polyisocyanate and comprising from 2 to 30 carbon atoms.

DESCRIPTION OF THE INVENTION

Figure 1:
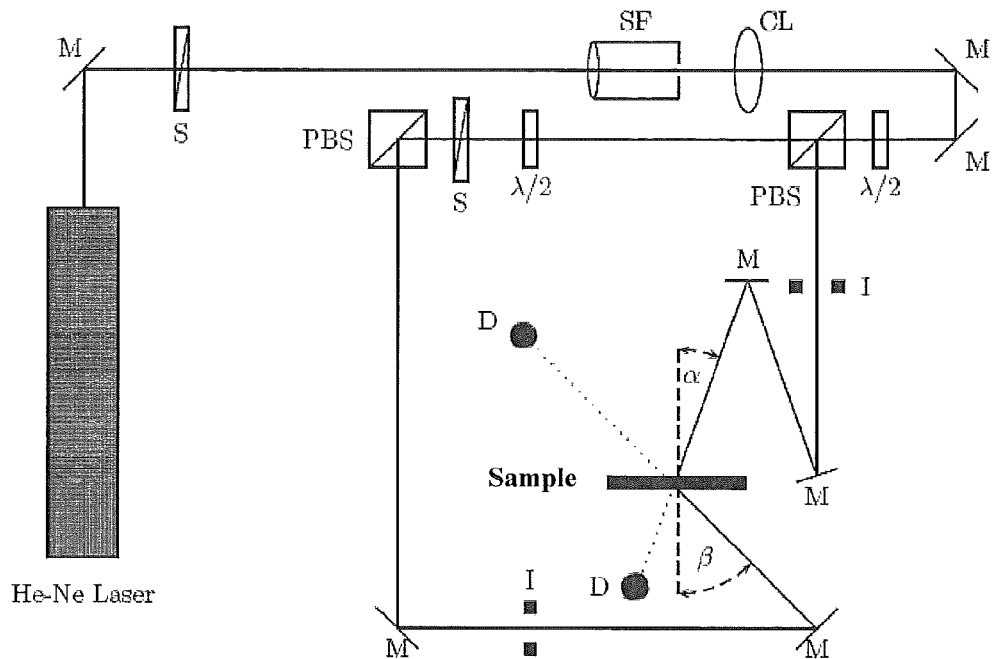
FIG. 1 depicts the holographic experimental setup with which the diffraction efficiency (DE) of the media was measured.

It has now surprisingly been found that the above requirements are very well met if glycidyl ether acrylate urethanes are used as writing monomers and these are incorporated into a polymer composition containing a binder system.

The invention therefore relates to photopolymer compositions comprising a) at least one unsaturated glycidyl ether acrylate urethane of the general formula (1a) or (1b) or mixtures of (1a) and (1b)

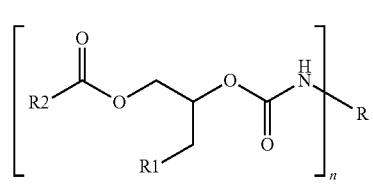

formula 1a

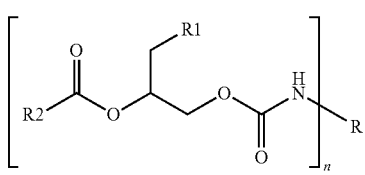

formula 1b in which n is a natural number from 2 to 6,

R1 is a mono- or polynuclear organic radical containing aromatic groups and having 4 to 36 carbon atoms, R2 is an olefinically unsaturated radical having 3 to 30 carbon atoms and R is an organic radical derived from aliphatic or aromatic di- or polyisocyanate and having 2 to 30 carbon atoms, b) a binder system c) at least one photoinitiator system d) optionally free radical stabilizers, catalysts and further additives.

The invention furthermore relates to a process for the production of media for recording visual holograms, in which the photopolymer compositions according to the invention are applied to a substrate or in a mould and are cured. The invention furthermore relates to media obtainable therefrom and intended for recording visual holograms and to the use thereof as optical elements or images or for image representation or projection. The invention likewise relates to a method for recording a hologram, in which such media are used.

The unsaturated glycidyl ether acrylate urethanes of the formula 1a or 1b can be prepared in a 2-stage synthesis. In the first reaction, an unsaturated acid R2-COOH is reacted with an epoxide R1-CH$_2$—CHOCH$_2$, a mixture of two alcohols being formed according to formula 3.

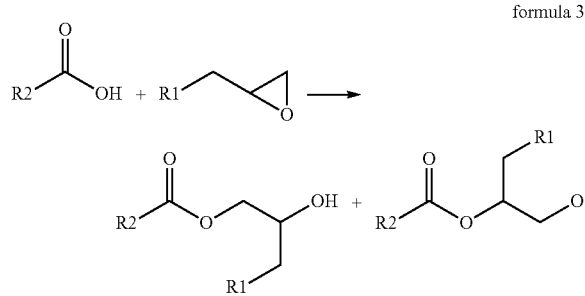

formula 3

In a second reaction step, the alcohol mixture is urethanized by means of a di- or polyisocyanate R(NCO)$_n$ of functionality n to give the glycidyl ether acrylate urethane according to the invention (formula 4).

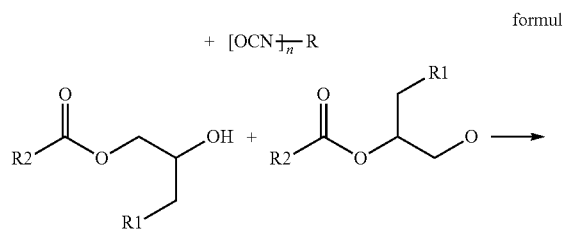

formula 4

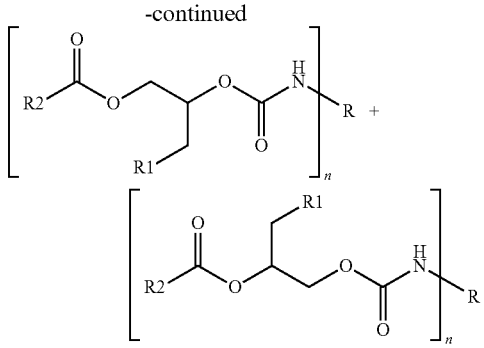

Radicals R1 which contain a mono- or polynuclear aromatic groups having 4 to 36 carbon atoms, preferably 5 to 20 carbon atoms, particularly preferably 6 to 16 carbon atoms, are suitable as epoxides of the general formula R1-CH$_2$—CHOCH$_2$.

Thus, these are in particular substituted oxyphenyl radicals having one to five identical or different substituents on the phenyl ring, such as chlorine, bromine, iodine, methyl, ethyl, n-propyl and isopropyl, n-butyl, isobutyl and tert-butyl, phenyl, aryloxy, benzoyl, acyl, methoxy, benzyl, methylthio, ethylthio, propylthio, butylthio, phenylthio, naphthylthio and napthyl.

Furthermore, polynuclear aromatic and heteraromatic radicals R1 can be used, such as oxynaphthyl, oxynapthylmethyl, oxyanthracenyl, oxyphenanthryl, N-carbazolyl, N-alkylcarbazolzyl, N-phthalimidyl, N-phenothiazinyl, N-alkylphenothiazinyl, oxytriarylmethyl, such as, for example, oxytriphenylmethyl. These polynuclear aromatic and heteroaromatic radicals R1 may also be substituted, such as, for example, with substituents such as chlorine, bromine, iodine, methyl, ethyl, n-propyl and isopropyl, n-butyl, isobutyl and tert-butyl, phenyl, aryloxy, benzoyl, acyl, methoxy, benzyl, methylthio, ethylthio, propylthio, butylthio, phenylthio, naphthylthio and napthyl.

Preferred radicals R1 are oxyphenyl, oxybromophenyl, oxydibromophenyl and oxynaphthyl, particularly preferably oxyphenyl, oxydibromophenyl and oxynaphthyl.

The acids R2-COOH contain an unsaturated radical R having 2 to 30 carbon atoms, preferably 2 to 20 carbon atoms, particularly preferably 2 to 9 carbon atoms. Acrylic acid, methacrylic acid, 3-acrylyloxypropionic acid, cinnamic acid, crotonic acid and adducts of a monoanhydride with hydroxyethyl (meth)acrylate, hydroxypropyl (meth)acrylate and hydroxybutyl acrylate are suitable as acids of R2-COOH. Suitable monoanhydrides are: maleic anhydride, succinic anhydride, itaconic anhydride, tetrahydrophthalic anhydride, 5-norbornene-endo-2,3-dicarboxylic acid anhydride, hexahydrophthalic anhydride; phenylsuccinic anhydride, benzylsuccinic anhydride, isatoic anhydride, bromoisatoic anhydride, bromophthalic anhydrides, chlorophthalic anhydride, tetrabromophthalic anhydride, tetrachlorophthalic anhydride, 4-bromo-1,8-naphthalic anhydrides, mono- and dibromomaleic anhydride, diphenylmaleic anhydride, 5-norbornene-2,3-dicarboxylic anhydrides, 2,3-naphthalic anhydride, 1,8-naphthalic anhydrides, exo-3,6-methylene-1,2,3,6-tetrahydrophthalic anhydrides and tetraphenylphthalic anhydrides.

Acrylic acid, methacrylic acid, 3-acrylyloxypropionic acid and the adducts of hydroxyethyl and hydroxybutyl acrylate with maleic anhydride are preferred.

Acrylic acid, methacrylic acid and 3-acrylyloxypropionic acid are particularly preferred.

All aliphatic, cycloaliphatic, aromatic or araliphatic di- and polyisocyanates known per se to the person skilled in the art are suitable as polyisocyanates $R(NCO)_n$. These are prepared in a known manner from di- or triamines, it being unimportant whether these were obtained by means of phosgenation or by phosgene-free processes. The radical R is an organic radical having 2 to 30 carbon atoms, preferably 4 to 30 carbon atoms, particularly preferably 6 to 24 carbon atoms.

For example, suitable isocyanates are butylene diisocyanate, hexamethylene diisocyanate (HDI), 1,8-octamethylene diisocyanate, 1,11-undecamethylene diisocyanate, 1,12-dodecamethylene diisocyanate, 2,2,4- or 2,4,4-trimethyl-1,6-hexamethylene diisocyanate (TMDI), 1,3- and 1,4-cyclohexane diisocyanate, 1-isocyanato-3-isocyanatomethyl-3,5,5-trimethylcyclohexane (IPDI), 1-isocyanato-1-methyl-4(3)-isocyanatomethylcyclohexane (IMCI), 1,4-phenylene diisocyanate, 1,5-naphthylene diisocyanate, 1-isocyanato-2-isocyanatomethylcyclopentane, (4,4'- and/or 2,4'-)diisocyanatodicyclohexylmethane (H12-MDI, W), bis(4-isocyanato-3-methylcyclohexyl)methane, xylylene diisocyanate (XDI), tetramethyl-1,3- and/or -1,4-xylylene diisocyanate (TMXDI), 1,3- and/or 1,4-hexahydroxylylene diisocyanate (H6-XDI), 2,4- and/or 2,6-hexahydrotoluylene diisocyanate (H6-TDI), 2,4- and/or 2,6-toluene diisocyanate (TDI), 4,4'- and/or 2,4'-diphenylmethane diisocyanate (MDI), norbornane diisocyanate, isocyanatomethyl-1,8-octane diisocyanate (TIN) and 1,8-diisocyanato-4-(isocyanatomethyl)octane, triphenylmethane 4,4',4"-triisocyanate and tris(p-isocyanatophenyl) thiophosphates (RFE), 1-methylbenzene 2,4,6-triisocyanates, naphthalene 1,3,7-triisocyanate and the isomers thereof, biphenyl-2,4,4'-triisocyanate and the isomers thereof, 2,4,4'-diphenylmethane triisocyanate and the isomers thereof.

In addition, the higher molecular weight secondary products of monomeric di- and/or triisocyanates with carbodiimide, acyl urea, isocyanurate, allophanate, biuret, oxadiazinetrione, uretdione or iminooxadiazinedione structure, which are well known per se to the person skilled in the art, can also be used.

2,6-Hexamethylene diisocyanate, 2,4,4-trimethyl-1,6-hexamethylene diisocyanate, isocyanatomethyl-1,8-octane diisocyanate, tris(p-isocyanatophenyl) thiophosphates, tris (4,4'- and/or 2,4'-)diisocyanatodicyclohexylmethane, 1-isocyanato-3-isocyanatomethyl-3,5,5-trimethylcyclohexane, diisocyanatodicyclohexylmethane 2,4- and/or 2,6-toluidene diisocyanate and trimers of hexamethylene diisocyanate having an isocyanurate and/or iminooxadiazinetrione structure are particularly preferred.

In a preferred embodiment of the invention, glycidyl ether acrylate urethanes which have a refractive index at 405 nm of greater than 1.53, particularly preferably greater than 1.55, very particularly preferably greater than 1.555, are used in a).

Suitable binder systems b) are amorphous thermoplastics, such as polyacrylates, polymethyl methacrylates or copolymers of methyl methacrylate, methacrylic acid or other alkyl acrylates and alkyl methacrylates, and acrylic acid; polyvinyl acetate and its partly hydrolysed derivatives, such as polyvinyl alcohols, gelatin, cellulose esters and cellulose ethers, such as cellulose acetobutyrate, and polyethylene oxides.

Furthermore, crosslinked binders which are composed of a functional binder and optionally a crosslinking agent are also suitable. Two-component epoxy systems and urethane systems are suitable for this purpose. Two-component urethane systems are preferred.

For the application of urethane crosslinking, a polyisocyanate crosslinking agent and a hydroxy- or amine-functional resin are required for this purpose.

Suitable compounds of the polyisocyanate crosslinking agents are all aliphatic, cycloaliphatic, aromatic or araliphatic di- and triisocyanates known per se to the person skilled in the art, it being unimportant whether these were obtained by means of phosgenation or by phosgene-free processes. In addition, the higher molecular weight secondary products (oligo- and polyisocyanates) of the monomeric di- and/or triisocyanates having a urethane, urea, carbodiimide, acylurea, isocyanurate, allophanate, biuret, oxadiazinetrione, uretdione or iminooxadiazinedione structure, which are well known per se to the person skilled in the art, can also be used, in each case individually or in any desired mixtures.

Monomeric di- or triisocyanates, such as butylene diisocyanate, hexamethylene diisocyanate (HDI), isophorone diisocyanate (IPDI), trimethylhexamethylene diisocyanate (TMDI), 1,8-diisocyanato-4-(isocyanatomethyl)octane, isocyanatomethyl-1,8-octane diisocyanate (TIN), 2,4- and/or 2,6-toluylene diisocyanate, are suitable. The trimers of hexamethylene diisocyanate having an isocyanurate and/or iminooxadiazinetrione structure are also suitable.

The use of isocyanate-functional polymers having urethane, allophanate or biuret structures as compounds of component A), as can be obtained in a manner known well per se by reacting the abovementioned di-, tri- or polyisocyanates in excess with hydroxy- or amino-functional compounds, is also possible. Any unconverted starting isocyanate can subsequently be removed in order to obtain products having a low monomer content. The use of catalysts well known per se to the person skilled in the art from polyurethane chemistry may be helpful for accelerating the prepolymer formation.

Oligo- and polyisocyanates derived from monomeric diisocyanates having a urethane, urea, carbodiimide, acylurea, isocyanurate, allophanate, biuret, oxadiazinetrione, uretdione or iminooxadiazinedione structure, which in each case are used individually or in any desired mixtures with one another, are preferably suitable.

Oligo- and polyisocyanates of alphatic diisocyanates having an isocyanurate, allophanate, biuret, uretdione or iminooxadiazinedione structure, which in each case are used individually or in any desired mixtures with one another, are particularly preferred.

Suitable hydroxy- or amine-functional resins are di- or polyols and/or di- or polyamines having a number average molecular weight in the range from 500 to 13 000 g/mol, preferably 700 to 8500 g/mol.

Preferred resins for this purpose have an average functionality of 1.5 to 3.5, preferably of 1.8 to 3.2, particularly preferably of 1.9 to 3.1.

Such polyols of the abovementioned type are, for example, polyester alcohols based on aliphatic, cycloaliphatic and/or aromatic di-, tri- and/or polycarboxylic acids with di-, tri-, and/or polyfunctional alcohols and lactone-based polyester alcohols.

Preferred polyester alcohols having a molecular weight preferably of 500 to 4000, particularly preferably 650 to 2500 g/mol are, for example, reaction products of adipic acid with hexanediol, butanediol or neopentylglycol or mixtures of said diols.

Also suitable are polyetherpolyols which are obtainable by polymerization of cyclic ethers or by reaction of alkylene oxides with a starter molecule.

The polyethylene glycols and/or polypropylene glycols having a number average molecular weight of 500 to 13 000 g/mol, and furthermore polytetrahydrofurans having a number average molecular weight of 500 to 8000, preferably of 650 to 3000 g/mol may be mentioned by way of example.

Preferred polyetherpolyols are polyethylene/polypropylene glycols have a polypropylene content of at least 70% and a functionality of 1.9 to 3.1.

Also suitable are polyester-polyether-polyester block polyols, which can be obtained by reacting polyetherpolyols with lactones.

Polyester-polyether-polyester block polyols are preferred; polyester-polyether-polyester block polyols based on polytetrahydrofurans having a number average molecular weight of 200 to 2000 g/mol and ε-caprolactone are particularly preferred, these polyester-polyether-polyester block polyols having a number average molecular weight of 1000 to 8000 g/mol.

Also suitable are hydroxyl-terminated polycarbonates, which are obtainable by reacting diols or lactone-modified diols or bisphenols, such as, for example, bisphenol A, with phosgene or carbonic acid diesters such as diphenyl carbonate or dimethyl carbonate.

The polymeric carbonates of 1,6-hexanediol, having a number average molecular weight of 500 to 8000 g/mol, and the carbonates of reaction products of 1,6-hexanediol with ε-caprolactone in the molar ratio of from 1 to 0.1 may be mentioned by way of example. Preferred carbonates are abovementioned polycarbonatediols having a number average molecular weight of 650 to 3000 g/mol and based on 1,6-hexanediol and/or carbonates of reaction products of 1,6-hexanediol with ε-caprolactone in the molar ratio of from 1 to 0.33.

Hydroxyl-terminated polyamidoalcohols and hydroxyl-terminated polyacrylatediols, e.g. Tegomer® BD 1000 (from Tego GmbH, Essen, Germany), can likewise be used.

Polyethylene/polypropylene glycols having a polypropylene content of at least 70% and a functionality of 1.9 to 2.5 and polyester-polyether-polyester block polyols based on polytetrahydrofurans having a number average molecular weight of 400 to 1400 g/mol and ε-caprolactone are particularly preferred, these polyester-polyether-polyester block polyols having a number average molecular weight of 1500 to 4000 g/mol.

One or more photoinitiators are used as photoinitiator c). These are usually initiators which can be activated by actinic radiation and initiate polymerization of the corresponding polymerizable groups. Photoinitiators are commercially distributed compounds known per se, a distinction being made between monomolecular (type I) and bimolecular (type II) initiators. Furthermore, depending on the chemical nature, these initiators are used for free radical, anionic (or) cationic (or mixed) forms of the abovementioned polymerizations.

(Type I) systems for free radical photopolymerization are, for example, aromatic ketone compounds, e.g. benzophenones in combination with tertiary amines, alkylbenzophenones, 4,4'-bis(dimethylamino)benzophenone (Michler's ketone), anthrone and halogenated benzophenones or mixtures of said types. Furthermore suitable are (type II) initiators, such as benzoin and its derivatives, benzyl ketals, acylphosphine oxides, e.g. 2,4,6-trimethylbenzoyldiphenylphosphine oxide, bisacylophosphine oxide, phenylglyoxylic acid esters, camphorquinone, alpha-aminoalkylphenone, alpha-,alpha-dialkoxyacetophenone, 1-[4-(phenylthio)phenyl]octane-1,2-dione-2-(O-benzoyloxime) and alpha-hydroxyalkylphenone. The photoinitiator systems described in EP-A 0223587 and consisting of a mixture of an ammonium arylborate and one or more dyes can also be used as a photoinitiator. For example, tetrabutylammonium triphenylhexylborate, tetrabutylammonium tris(3-fluorophenyl)hexylborate and tetrabutylammonium tris(3-chloro-4-methylphenyl)hexylborate are suitable as ammoniumaryl borate. Suitable dyes are, for example, new methylene blue, thionine, Basic Yellow, pinacynol chloride, rhodamine 6G, gallocyanine, ethyl violet, Victoria Blue R, Celestine Blue, quinaldine red, crystal violet, brilliant green, Astrazon Orange G, Darrow Red, Pyronine Y, Basic Red 29, pyrillium I, cyanine and methylene blue, azure A.

It may also be advantageous to use mixtures of these compounds. Depending on the radiation source used for the curing, type and concentration of photoinitiator must be adapted in a manner known to the person skilled in the art. The abovementioned approach with regard to the photopolymerization is easily possible for a person skilled in the art in the form of routine experiments within the below-mentioned quantity ranges of the components and the synthesis components available in each case for choice, in particular the preferred synthesis components.

Preferred photoinitiators C) are mixtures of tetrabutylammonium tetrahexylborate, tetrabutylammonium triphenylhexylborate, tetrabutylammonium tris(3-fluorophenyl)hexylborate and tetrabutylammonium tris(3-chloro-4-methylphenyl)hexylborate with dyes, such as, for example, Astrazon Orange G, methylene blue, new methylene blue, azure A, pyrillium I, safranine O, cyanine, gallocyanine, brilliant green, crystal violet, ethyl violet and thionine.

In addition to components a) to c), free radical stabilizers, catalysts and further additives may also be concomitantly used.

Suitable free radical stabilizers are inhibitors and antioxidants as described in "Methoden der organischen Chemie [Methods of Organic Chemistry]" (Houben-Weyl), 4th edition, Volume XIV/1, page 433 et seq., Georg Thieme Verlag, Stuttgart 1961. Suitable classes of substances are, for example, phenols, such as, for example, 2,6-di-tert-butyl-4-methylphenol, kresols, hydroquinones, benzyl alcohols, such as, for example, benzhydrol, optionally also quinones, such as, for example, 2,5-di-tert-butylquinone, optionally also aromatic amines, such as diisopropylamine or phenothiazine. Preferred free radical stabilizers are 2,6-di-tert-butyl-4-methylphenol, phenothiazine and benzhydrol.

Furthermore, one or more catalysts may be used. These preferably catalyse the urethane formation Amines and metal compounds of metals tin, zinc, iron, bismuth, molybdenum, cobalt, calcium, magnesium and zirconium are preferably suitable for this purpose. Tin octanoate, zinc octanoate, dibutyltin dilaurate, dimethyltin dicarboxylate, iron(III) acetylacetonate, iron(II) chloride, zinc chloride, tetraalkylammonium hydroxides, alkali metal hydroxides, alkali metal alcoholates, alkali metal salts of long-chain fatty acids having 10 to 20 carbon atoms and optionally OH side groups, lead octanoate or tertiary amines, such as triethylamine, tributylamine, dimethylbenzylamine, dicyclohexylmethylamine, dimethylcyclohexylamine, N,N,N',N'-tetramethyldiaminodiethyl ether, bis(dimethylaminopropyl)urea, N-methyl- or N-ethylmorpholine, N,N'-dimorpholinodiethyl ether (DMDEE), N-cyclohexylmorpholine, N,N,N',N'-tetramethylethylenediamine, N,N,N',N'-tetramethylbutanediamine, N,N,N',N'-tetramethylhexane-1,6-diamine, pentamethyldiethylenetriamine, dimethylpiperazine, N-dimethylaminoethylpiperidine, 1,2-dimethylimidazole, N-hydroxypropylimidazole, 1-azabicyclo[2,2,0]octane, 1,4-diazabicyclo[2,2,2]octane (Dabco), or alkanolamine compounds, such as triethanolamine, triisopropanolamine, N-methyl- and N-ethyldiethanolamine, dimethylaminoethanol, 2-(N,N-dimethylaminoethoxy)ethanol, or N-tris(dialkylaminoalkyl) hexahydrotriazines, e.g. N,N',N-tris(dimethylaminopropyl)-s-hexahydrotriazine, diazabicyclononane, diazabicycloundecane, 1,1,3,3-tetramethylguanidine, 1,3,4,6,7,8-hexahydro-1-methyl-2H-pyrimido(1,2-a)pyrimidine are particularly preferred.

Particularly preferred catalysts are dibutyltin dilaurate, dimethyltin dicarboxylate, iron(III) acetylacetonate, 1,4-diazabicyclo[2.2.2]octane, diazabicyclononane, diazabicycloundecane, 1,1,3,3-tetramethylguanidine, 1,3,4,6,7,8-hexahydro-1-methyl-2H-pyrimido(1,2-a)pyrimidine.

For example, solvents, plasticizers, levelling agents, wetting agents, antifoams or adhesion promoters, but also polyurethanes, thermoplastic polymers, oligomers, and further compounds having functional groups consisting of, for example, acetals, epoxides, oxetanes, oxazolines, dioxolanes and/or hydrophilic groups, such as, for example, salts and/or polyethylene oxides, may be present as further auxiliaries and additives.

Preferably used solvents are readily volatile solvents having good compatibility with the 2-component formulations according to the invention, for example, ethyl acetate, butyl acetate, acetone.

Preferably used plasticizers are liquids having good dissolving properties, low volatility and a high boiling point. It may also be advantageous simultaneously to use a plurality of additives of one type. Of course, it may also be advantageous to use a plurality of additives of a plurality of types.

The process according to the invention for the production of media for recording visual holograms is preferably carried out by a procedure in which the synthesis components of the photopolymers according to the invention are homogeneously mixed. In the preferred case of a binder crosslinked by means of urethane formation, all components, with the exception of the polyisocyanate, are mixed homogeneously with one another and, immediately before the application to the substrate or in the mould, polyisocyanate is added and mixing is effected.

All methods and apparatuses known per se to the person skilled in the art from mixing technology constituting, for example, stirred tanks or both dynamic and static mixers, can be used for mixing. However, apparatuses without dead spaces or with only few dead spaces are preferred. Furthermore, methods in which the mixing is effected within a very short time and with very vigorous mixing of the two components to be mixed with one another are preferred. In particular, dynamic mixers, especially those in which the components come into contact with one another only in the mixer, are suitable for this purpose.

The temperatures during this procedure are 0 to 100° C., preferably 10 to 80° C., particularly preferably 20 to 60° C., very particularly preferably 20 to 40° C.

If necessary, devolatilization of the individual components or of the total mixture under a reduced pressure of, for example, 1 mbar can also be carried out. Devolatilization, in particular after addition of component b), is preferred for preventing bubble formation by residue of gases in the media obtainable.

For admixing the polyisocyanate, the mixtures can be stored as a storage-stable intermediate, optionally over several months.

After the admixing of the polyisocyanate, a clear, liquid formulation is obtained which, depending on the composition, cures at room temperature within a few seconds to a few hours.

The ratio and the type and reactivity of the synthesis components of the polyurethane compositions is preferably adjusted so that the curing after admixing of the polyisocyanate occurs at room temperature within minutes to one hour. In a preferred embodiment, the curing is accelerated by heating the formulation after the admixing to temperatures between 30 and 180° C., preferably 40 to 120° C., particularly preferably 50 to 100° C.

The abovementioned approach with regard to the curing behaviour is easily possible for a person skilled in the art easily in the form of routine experiments within the abovementioned quantity range of the components and the synthesis components available in each case for choice, in particular the preferred synthesis components.

The photopolymer compositions according to the invention have viscosities at 25° C. of, typically, 10 to 100 000 mPas, preferably 100 to 20 000 mPas, particularly preferably 200 to 15 000 mPas, especially preferably 500 to 10 000 mPas, immediately after complete mixing of all components, so that they have very good processing properties even in solvent-free form. In solution with suitable solvents, viscosities at 25° C. below 10 000 mPas, preferably below 2000 mPas, particularly preferably below 500 mPas, can be established.

Photopolymer compositions of the abovementioned type which cure in less than 4 hours at 25° C. in an amount of 15 g and with a catalyst content of 0.004% by weight or cure in less than 10 minutes at 25° C. with a catalyst content of 0.02% by weight have proved to be advantageous.

For application to a substrate or in a mould, all respective customary methods known to persons skilled in the art are suitable, such as, in particular, knife coating, casting, printing, screen printing, spraying or inkjet printing.

Holograms for optical applications can be produced in the entire visible and near UV ranges (300-800 nm) by appropriate exposure processes using the photopolymer compositions according to the invention. Visual holograms comprise all holograms which can be recorded by methods known to the person skilled in the art, including, inter alia, in-line (Gabor) holograms, off-axis holograms, full-aperture transfer holograms, white light transmission holograms ("rainbow holograms"), Denisyuk holograms, off-axis reflection holograms, edge-lit holograms and holographic stereograms; reflection holograms, Denisyuk holograms and transmission holograms are preferred. Possible optical functions of the holograms which can be produced using the photopolymer compositions according to the invention correspond to the optical functions of light elements, such as lenses, mirrors, deflecting mirrors, filters, diffusion screens, diffraction elements, light conductors, waveguides, projection screens and/or masks. Frequently, these optical elements show a frequency selectivity, depending on how the holograms were exposed and which dimensions the hologram has.

In addition, by means of the photopolymer compositions according to the invention, it is also possible to produce holographic images or presentations, such as, for example, personal portraits, biometric presentations in security documents, or generally images or image structures for advertizing, security labels, trademark protection, trademark branding, labels, design elements, decorations, illustrations, reward cards, images and the like, and images which could represent digital data, inter alia also in combination with the products described above. Holographic images give the impression of a three-dimensional image, but they can also represent image sequences, short films or a number of different objects, depending on the angle from which they are illuminated, the light source with which they are illuminated (including moving ones), etc. Owing to these versatile potential designs, holograms, in particular volume holograms, are an attractive technical solution for the abovementioned application.

The invention furthermore relates to those glycidyl ether acrylate urethanes of the general formula (1a) or (1b) in which n is a natural number from 2 to 6, R1 is a halogen- and/or alkylthio- and/or arylthio-substituted oxyphenyl ring or is a halogen-, alkyl-, aryl-, alkylthio- or arylthio-substituted oxynaphthyl, oxyanthracenyl-, oxyphenanthryl-, N-carbazolyl, N-alkylcarbazolzyl, N-phthalimidyl, N-phenothiazinyl, N-alkylphenothiazinyl, oxytriarylmethyl radical, R2 is an olefinically unsaturated radical having 2 to 30 carbon atoms, R is an organic radical derived from an aliphatic or aromatic di- or polyisocyanate and having 2 to 30 carbon atoms.

Preferred glycidyl ether acrylate urethanes according to the invention are those in which n is the number 2-4, R1 is a halogen- and/or alkylthio- and/or arylthio-substituted oxyphenyl ring or a halogen-, alkyl-, aryl-, alkylthio- or arylthio-substituted oxynaphthyl or oxyanthracenyl radical, R2 is an olefinically unsaturated radical having 2 to 20 carbon atoms, R is an organic radical derived from an aliphatic or aromatic di- or polyisocyanate and having 6 to 24 carbon atoms.

Particularly preferred glycidyl ether acrylate urethanes according to the invention are those in which n is the number 2 or 3, R1 is oxybromophenyl, oxydibromophenyl or oxynaphthyl, R2 is derived from R2-COOH, R2-COOH being acrylic acid, methacrylic acid, carboxyethyl acrylate or an adduct of hydroxyethyl acrylate and maleic anhydride ($CH_2$=CH—OO—O—$CH_2$—$CH_2$—O—CO—CH=CH—COOH), R is derived from R(NCO)$_n$, R(NCO)$_n$ corresponding to 2,6-hexamethylene diisocyanate, 2,4,4-trimethyl-1,6-hexamethylene diisocyanate, isocyanatomethyl-1,8-octane diisocyanate, tris(p-isocyanatophenyl) thiophosphates, tris(4,4'- and/or 2,4'-) diisocyanatodicyclohexylmethane, 1-isocyanato-3-isocyanatomethyl-3,5,5-trimethylcyclohexane, diisocyanatodicyclohexylmethane, 2,4- and/or 2,6-toluidene diisocyanate and trimers of hexamethylene diisocyanate having isocyanurate and/or iminooxadiazinetrione structure.

All the references described above are incorporated by reference in their entireties for all useful purposes.

While there is shown and described certain specific structures embodying the invention, it will be manifest to those skilled in the art that various modifications and rearrangements of the parts may be made without departing from the spirit and scope of the underlying inventive concept and that the same is not limited to the particular forms herein shown and described.

EXAMPLES

Unless noted otherwise, all stated percentages are based on percent by weight.

Examples 1-8c illustrate the preparation of writing monomers according to the general formula 1a/1b:

Example 1

156.5 g of dibromophenyl glycidyl ether (Denacol EX147, obtainable from Nagase ChemTex, Japan), 36 g of acrylic acid, 0.0019 g of 2,6-di-tert-butyl-4-methylphenol and 0.328 of triphenylphosphine were initially introduced into a three-necked flask having a reflux condenser and stirrer. In addition, air was slowly passed through and heating to 90 C was effected. Stirring was effected for 60 h. A clear, liquid product that, according to 1-H-NMR, no longer contained epoxide was obtained.

Example 1a 30.8 g of the product from Example 1 and 6.96 g of 2,4-toluidene diisocyanate (Desmodur T100, Bayer MaterialScience AG, Leverkusen, Germany) were initially introduced into a three-necked flask having a reflux condenser and stirrer. In addition, air was slowly passed through and heating to 60 C was effected. After the initial exothermicity to 80 C, the product was stirred for 80 minutes at 60 C. A clear glassy product having NCO=0% was obtained.

Examples 1b-1d

The following examples were carried out analogously to Example 1a. Details in this respect are to be found in Table 1

TABLE 1

| Example | Raw material 1 Product of Example 1 | Raw material 2 Isocyanate | Raw material 3 | Reaction time | Product |
|---|---|---|---|---|---|
| 1b | 26.95 g | 5.88 g HDI | — | 17 h | Clear, tacky mass |
| 1c | 26.95 g | 7.35 g TMDI | — | 17 h | Clear, tacky mass |
| 1d | 19.11 g | 4.19 g TIN | 0.01 g KB | 17 h | Clear glass sintering at room temperature |
| 1e | 26.95 g | 40.81 g RFE | 2 drops of DBTL after 18 h | 18 h + 4 h | Ethyl acetate is distilled off, then clear, highly viscose, tacky product |
| 1f | 26.95 g | 9.17 g W | — | 20 h | Clear glass sintering at room temperature |
| 1g | 26.95 g | 7.77 g IPDI | — | 20 h | A clear, tacky sintering glass |
| 1h | 26.95 g | 8.75 g M44 | — | 20 h | Clear, tacky sintering glass |
| 1i | 23.10 g | 10.63 g XP2410 | — | 20.5 h | Clear glass sintering at room temperature |

TDI: 2,4-Toluidene diisocyanate (Desmodur T100, Bayer MaterialScience AG, Leverkusen, Germany)
HDI: 2,6-Hexamethylene diisocyanate (Desmodur H, Bayer MaterialScience AG, Leverkusen, Germany)
TMDI: 2,4,4-Trimethyl-1,6-hexamethylene diisocyanate
TIN: Isocyanatomethyl-1,8-octane diisocyanate
RFE: 27% solution of tris(p-isocyanatophenyl) thiophosphates in ethyl acetate (Desmodur RFE, Bayer MaterialScience AG, Leverkusen, Germany)
W: Mixture of tris(4,4'- and 2,4'-)diisocyanatodicyclohexylmethane (Desmodur W, Bayer MaterialScience AG, Leverkusen, Germany)
IPDI: 1-Isocyanato-3-isocyanatomethyl-3,5,5-trimethylcyclohexane (Desmodur I, Bayer MaterialScience AG, Leverkusen, Germany)
M44: Diisocyanatodicyclohexylmethane (Desmodur M44, Bayer MaterialScience AG, Leverkusen, Germany)
XP2410: Trimer of hexamethylene diisocyanate having a predominantly iminooxadiazinetrione structure (Desmodur XP2410, Bayer MaterialScience AG, Leverkusen, Germany)
T80: 80:20 mixtures of 2,4- and 2,6-toluidene diisocyanate (Desmodur T80, Bayer MaterialScience AG, Leverkusen, Germany)
KB: 2,6-Di-tert-butyl-4-methylphenol
DBTL: Dibutyltin dilaurate

Example 2

150.2 g of alpha-naphthyl glycidyl ether (SACHEM Europe B.V., ZALTBOMMEL, THE NETHERLANDS), 54 g of acrylic acid, 0.492 g of triphenylphosphine and 0.002 g of 2,6-di-tert-butyl-4-methylphenol were initially introduced into a three-necked flask having a reflux condenser and stirrer. In addition, air was slowly passed through and thermostatting was effected at 90 C and stirring was effected for 60 hours. According to $^1$H-NMR, the reddish brown viscose product no longer contained epoxide.

Examples 2a-2d

The following examples were carried out analogously to Example 1a. Details in this respect are to be found in Table 2

TABLE 2

| Example | Raw material 1 Product of Example 2 | Raw material 2 Isocyanate | Raw material 3 | Reaction time | Product |
|---|---|---|---|---|---|
| 2a | 54.5 g | 17.4 g TDI | 0.014 g KB | 0.5 h | Solid brownish glassy product |
| 2b | 19.1 g | 5.9 g HDI | 0.002 g DBTL | 19 h | Brownish clear, viscose product |
| 2c | 21.24 g | 5.86 g TIN | 0.0027 g KB | 23 h | Brownish, clear, tacky product having an NCO content of 0.1% |
| 2d | 16.3 g | 35 g RFE | 0.005 g DBTL | 19 h | Ethyl acetate is distilled off, brownish clear, glassy product |

For abbreviations, see Table 1

Example 3

93.9 g of dibromophenyl glycidyl ether (Denacol EX147, obtainable from Nagase ChemTex, Japan), 25.8 g of methacrylic acid, 0.197 g of triphenylphosphine and 0.0012 g of 2,6-di-tert-butyl-4-methylphenol were initially introduced into a three-necked flask having a reflux condenser and stirrer. In addition, air was slowly passed through and thermostatting was effected at 60 C. Stirring was effected for 48 h. A yellowish clear, liquid product having an OH number=142 mg KOH/g was obtained.

Examples 3a-3d

The following examples were carried out analogously to Example 1a. Details in this respect are to be found in Table 3

TABLE 3

| Example | Raw material 1 Product of Example 3 | Raw material 2 Isocyanate | Raw material 3 | Reaction time | Product |
|---|---|---|---|---|---|
| 3a | 27.7 g | 6.1 g TDI | 14.5 g CHCl3 | 6 h, then 3 mg DBTL | Light brown, clear, viscose product |
| 3b | 20.1 g | 4.2 g HDI | 0.002 g DBTL | 19 h | Yellowish, glassy product |
| 3c | 27.7 g | 5.9 g TIN | 0.0027 g KB | 20 h, then 5 mg DBTL | Yellowish glassy product |
| 3d | 20.1 g | 29.2 g RFE | 0.005 g DBTL | 19 h | Ethyl acetate is distilled off; clear glass sintering at room temperature | for abbreviations, see Table 1

Example 4.1

29.42 g of maleic anhydride, 0.32 g of triethylamine, 257 g of toluene and 0.06 g of 2,6-di-tert-butyl-4-methylphenol were initially introduced into a three-necked flask having a reflux condenser and stirrer. In addition, air was slowly passed through and thermostatting was effected at 85 C. Thereafter, 34.84 g of hydroxyethyl acrylate are added dropwise in the course of 15 minutes and stirring is effected for 11 hours. The mixture is freed from solvent, and a clear, viscose product is obtained.

Example 4.2

31.3 g of dibromophenyl glycidyl ether (Denacol EX147, obtainable from Nagase ChemTex, Japan), 21.4 g of the product from Example 4.1, 0.066 g of triphenylphosphine and 0.0005 g of 2,6-di-tert-butyl-4-methylphenol were initially introduced into a three-necked flask having a reflux condenser and stirrer. In addition, air was slowly passed through and thermostatting was effected at 90 C and stirring was effected for 19 hours. A clear liquid product was obtained.

Examples 4a-4-d

The following examples were carried out analogously to Example 1a. Details in this respect are to be found in Table 4

TABLE 4

| Example | Raw material 1 Product of Example 4.2 | Raw material 2 Isocyanate | Raw material 3 | Reaction time | Product |
|---|---|---|---|---|---|
| 4a | 14.1 g | 2.2 g TDI | 14.5 g CHCl3 | 20 h, then 5 mg DBTL | Yellowish, viscose product |
| 4b | 20.1 g | 2.9 g HDI | 0.002 g DBTL | 17 h | Clear, tacky liquid |
| 4c | 14.1 g | 2.1 g TIN | | 3 h, then 5 mg DBTL | Clear, viscose product |
| 4d | 18.9 g | 19.2 g RFE | 0.004 g DBTL | 17 h | Ethyl acetate is distilled off; clear, glassy product | for abbreviations, see Table 1

Example 5

112.7 g of phenyl glycidyl ether, 54 g of acrylic acid, 0.492 g of triphenylphosphine and 0.0017 g of 2,6-di-tert-butyl-4-methylphenol were initially introduced into a three-necked flask having a reflux condenser and stirrer. In addition, air was slowly passed through and thermostatting was effected at 90 C. Stirring was effected for 54 hours, and a clear, liquid, highly viscose product was obtained.

Examples 5a-5d

The following examples were carried out analogously to Example 1a. Details in this respect are to be found in Table 5

TABLE 5

| Example | Raw material 1 Product of Example 5 | Raw material 2 Isocyanate | Raw material 3 | Reaction time | Product |
|---|---|---|---|---|---|
| 5a | 22.4 g | 8.7 g TDI | | 20 h, then 5 mg DBTL | Clear, highly viscose product |
| 5b | 22.4 g | 8.4 g HDI | 0.002 g DBTL | 17 h | Clear, tacky liquid |
| 5c | 22.4 g | 8.4 g TIN | | 20 h, then 5 mg DBTL | Viscose clear product |
| 5d | 17.9 g | 46.6 g RFE | | 21 h | Ethyl acetate is distilled off; slightly brownish clear glass sintering at room temperature | for abbreviations, see Table 1

Example 6

93.9 g of dibromophenyl glycidyl ether (Denacol EX147, obtainable from Nagase ChemTex, Japan), 43.2 g of 2-carboxyethyl acrylate, 0.197 g of triphenylphosphine and 0.0014 g of 2,6-di-tert-butyl-4-methylphenol were initially introduced into a three-necked flask having a reflux condenser and stirrer. In addition, air was slowly passed through, thermostatting was effected at 90 C and stirring was effected for 43 hours. A crystalline, creamy, honey-like product having an OH number=123.9 mg KOH/g was obtained.

Examples 6a-6c

The following examples were carried out analogously to Example 1a. Details in this respect are to be found in Table 6

TABLE 6

| Example | Raw material 1 Product of Example 6 | Raw material 2 Isocyanate | Raw material 3 | Reaction time | Product |
|---|---|---|---|---|---|
| 6a | 20.7 g | 3.9 g T80 | 2 mg DBTL | 19 h | Milky white solid |
| 6b | 20.7 g | 3.8 g HDI | 2 mg DBTL | 19 h | Partly crystallized, tacky viscose solid |
| 6c | 18.4 g | 3.3 g TIN | 2.2 mg DBTL | 19 h | Partly crystallized, tacky viscose solid | for abbreviations, see Table 1

Example 7

70.1 g of alpha-naphthyl glycidyl ether (SACHEM Europe B.V., ZALTBOMMEL, THE NETHERLANDS), 50.4 g of 2-carboxyethyl acrylate, 0.459 g of triphenylphosphine and 0.0012 g of 2,6-di-tert-butyl-4-methylphenol were initially introduced into a three-necked flask having a reflux condenser and stirrer. In addition, air was slowly passed through and thermostatting was effected at 90 C. Stirring was effected for 26 hours, and a brownish clear liquid having an OH number of 158 mg KOH/g was obtained.

Examples 7a-7c

The following examples were carried out analogously to Example 1a. Details in this respect are to be found in Table 7

TABLE 7

| Example | Raw material 1 Product of Example 6 | Raw material 2 Isocyanate | Raw material 3 | Reaction time | Product |
|---|---|---|---|---|---|
| 7a | 17.8 g | 4.4 g T80 | 2 mg DBTL | 17 h | A clear, brownish glassy solid |
| 7b | 17.8 g | 4.2 g HDI | 2 mg DBTL | 18 h | Brown-red, semicrystalline product |
| 7c | 17.8 g | 4.2 g TIN | 2.2 mg DBTL | 18 h | Brown-red, semicrystalline product | for abbreviations, see Table 1

Example 8

20.0 g of alpha-naphthyl glycidyl ether (SACHEM Europe B.V., ZALTBOMMEL, THE NETHERLANDS), 22.5 g of the product from Example 4.1, 0.131 g of triphenylphosphine and 0.043 g of 2,6-di-tert-butyl-4-methylphenol were initially introduced into a three-necked flask having a reflux condenser and stirrer. In addition, air was slowly passed through and thermostatting was effected at 90 C and stirring was effected for 15 hours. A reddish, clear liquid having an OH number=135 mg KOH/g was obtained.

Examples 8a-8c

The following examples were carried out analogously to Example 1a. Details in this respect are to be found in Table 8

TABLE 8

| Example | Raw material 1 Product of Example 6 | Raw material 2 Isocyanate | Raw material 3 | Reaction time | Product |
|---|---|---|---|---|---|
| 8a | 19.9 g | 3.5 g T80 | 2 mg DBTL | 18 h | Brown-red, clear glassy product sintering at room temperature |
| 8b | 17.4 g | 2.9 g HDI | 2 mg DBTL | 18 h | Brown-red, clear, highly viscose product |
| 8c | 19.9 g | 3.3 g TIN | 2.3 mg DBTL | 18 h | Brown-red, clear, highly viscose product | for abbreviations, see Table 1

The writing monomers described above were now used for the preparation of the photopolymers according to the invention. The following components were used.

Desmodur® XP 2410 is an experimental product of Bayer MaterialScience AG, Leverkusen, Germany, hexane diisocyanate-based polyisocyanate, proportion of iminooxadiazinedione at least 30%, NCO content: 23.5%

Terathane® 1000 is a commercial product of BASF SE, Ludwigshafen, Germany (poly-THF having a number average molar mass of 1000 g/mol).

Polyol 1 is a difunctional poly(ε-caprolactone) polyol (number average molar mass about 650 g/mol).

All other polyols are commercial products of Bayer MaterialScience AG, Leverkusen, Germany, and the composition thereof is described in the examples on mention.

Fomrez® UL28: urethanization catalyst, dimethylbis [(1-oxoneodecyl)oxy]stannane, commercial product of Momentive Performance Chemicals, Wilton, Conn., USA (used as a 10% strength solution in N-ethylpyrrolidone).

CGI 909 is an experimental product sold in 2008 by Ciba Inc., Basel, Switzerland.

Preparation of polyol 1

0.18 g of tin octanoate, 374.8 g of ε-caprolactone and 374.8 g of a difunctional polytetrahydrofuran polyether polyol (Terathane® 1000, equivalent weight 500 g/mol OH) were initially introduced into a 1 l flask and heated to 120° C. and kept at this temperature until the solids content (proportion of non-volatile constituents) was 99.5% by weight or above. Thereafter cooling was effected and the product was obtained as a waxy solid.

Measurement of the Refractive Indices of the Photopolymerizable Monomers

The refractive index n as a function of the wavelength of the samples were obtained from the transmission and reflection spectra. For this purpose, about 100-300 nm thick films of the samples were applied by spin coating to quartz glass substrates from dilute solution in butyl acetate. The transmission and reflection spectrum of this layer packet was measured with a spectrometer from STEAG ETA-Optik, CD-Measurement System ETA-RT, and the layer thickness and the spectral curve of n were then fitted to the measured transmission and reflection spectra. This is effected using the internal software of the spectrometer and additionally requires the refractive index data of the quartz glass substrate, which were determined beforehand in a blank measurement. The refractive index $n_{Mo}$ is based on the wavelength of 405 nm and thus corresponds to $n_D^{20}$.

Measurement of the Holographic Properties De and an of the Holographic Media by Means of Two-Beam Interference in Reflection Arrangement The media produced as described in the section "production of the holographic media based on photopolymer formulation with photoinitiator for determining the performance parameters DE and Δn" were then tested with regard to their holographic properties by means of a measuring arrangement according to FIG. 1, as follows:

The beam of an He—Ne laser (emission wavelength 633 nm) was converted with the aid of the spatial filter (SF) and together with the collimation lens (CL) into a parallel homogeneous beam. The final cross sections of the signal and reference beam are established by the iris diaphragms (I). The diameter of the iris diaphragm opening is 0.4 cm. The polarization-dependent beam splitters (PBS) split the laser beam into two coherent equally polarized beams. Via the λ/2 plates, the power of the reference beam was adjusted to 0.5 mW and the power of the signal beam to 0.65 mW. The powers were determined using the semiconductor detectors (D) with sample removed. The angle of incidence (α) of the reference beam is 21.8° and the angle of incidence (β) of the signal beam is 41.8°. At the location of the sample (medium), the interference field of the two overlapping beams produced a grating of light and dark strips which are perpendicular to the angle bisectors of the two beams incident on the sample (reflection hologram). The strip spacing Λ, also referred to as grating period, in the medium is ~225 nm (the refractive index of the medium assumed to be ~1.504).

FIG. 1 shows the holographic experimental setup with which the diffraction efficiency (DE) of the media was measured. FIG. 1 shows the geometry of an HMT at λ=633 nm (He—Ne laser): M=mirror, S=shutter, SF=spatial filter, CL=collimation lens, λ/2=λ/2 plate, PBS=polarization-sensitive beam splitter, D=detector, I=iris diaphragm, α=21.8°, β=41.8° are the angles of incidence of the coherent beams, measured outside the sample (outside the medium).

Holograms are written into the medium in the following manner

Both shutters (S) are opened for the exposure time t.
Thereafter, with closed shutters (S), the medium was allowed a time of 5 minutes for diffusion of the still unpolymerized writing monomers.

The holograms written were now read in the following manner. The shutter of the signal beam remained closed. The shutter of the reference beam was opened. The iris diaphragm of the reference beam was closed to a diameter of <1 mm. This ensured that the beam was always completely in the previously written hologram for all angles (Ω) of the medium. The turntable, under computer control, covered the angle range from Ω=0° to Ω=20° with an angle step width of 0.05°. At each angle Ω approached, the powers of the beam transmitted in the zeroth order were measured by means of the corresponding detector D and the powers of the beam diffracted in the first order were measured by means of the detector D. The diffraction efficiency was obtained at each angle Ω approached as the quotient of:

$$\eta = \frac{P_D}{P_D + P_T}$$

$P_D$ is the power in the detector of the diffracted beam and $P_T$ is the power in the detector of the transmitted beam.

By means of the method described above, the Bragg curve (it describes the diffraction efficiency η as a function of the angle Ω of rotation of the written hologram) was measured and was stored in a computer. In addition, the intensity transmitted in the zeroth order was plotted against the angle Ω of rotation and stored in a computer.

The maximum diffraction efficiency (DE=$\eta_{max}$) of the hologram, i.e. its peak value, was determined. It may have been necessary for this purpose to change the position of the detector of the diffracted beam in order to determine this maximum value.

The refractive index contrast Δn and the thickness d of the photopolymer layer was now determined by means of the Coupled Wave Theory (cf. H. Kogelnik, The Bell System Technical Journal, Volume 48, November 1969, Number 9 page 2909-page 2947) from the measured Bragg curve and the variation of the transmitted intensity as a function of angle. The method is described below:

According to Kogelnik, the following is true for the Bragg curve η(Ω) of a reflection hologram:

$$\eta = \frac{1}{1 + \frac{1 - (\chi/\Phi)^2}{\sinh^2(\sqrt{\Phi^2 - \chi^2})}}$$

with:

$$\Phi = \frac{\pi \cdot \Delta n \cdot d}{\lambda \cdot \sqrt{\cos(\alpha') \cdot \cos(\alpha' - 2\psi)}}$$

$$\chi = \Delta\theta \cdot \frac{2\pi \cdot \sin(\alpha' - \psi)}{\Lambda \cdot \cos(\alpha' - 2\psi)} \cdot \frac{d}{2}$$

$$\psi = \frac{\beta' - \alpha'}{2}$$

$$\Lambda = \frac{\lambda}{2 \cdot n \cdot \cos(\psi - \alpha')}$$

$$n \cdot \sin(\alpha') = \sin(\alpha), \; n \cdot \sin(\beta') = \sin(\beta)$$

$$\Delta\theta = -\Delta\Omega \cdot \sqrt{\frac{1 - \sin^2(\alpha)}{n^2 - \sin^2(\alpha)}}$$

Φ is the grating thickness, χ is the detuning parameter and ψ is the angle of tilt of the refractive index grating which was written. α' and β' correspond to the angles α and β during writing of the hologram, but measured in the medium. Δ is the angle detuning measured in the medium, i.e. the deviation from the angle α'. ΔΩ is the angle detuning measured outside the medium, i.e. the deviation from the angle α. n is the average refractive index of the photopolymer and was set at 1.504. λ is the wavelength of the laser light in a vacuum.

The maximum diffraction efficiency (DE=$\eta_{max}$) is then obtained for χ=0, i.e. ΔΩ=0, as:

$$DE = \tanh^2(\Phi) = \tanh^2\left(\frac{\pi \cdot \Delta n \cdot d}{\lambda \cdot \sqrt{\cos(\alpha') \cdot \cos(\alpha' - 2\psi)}}\right)$$

Figure 2:
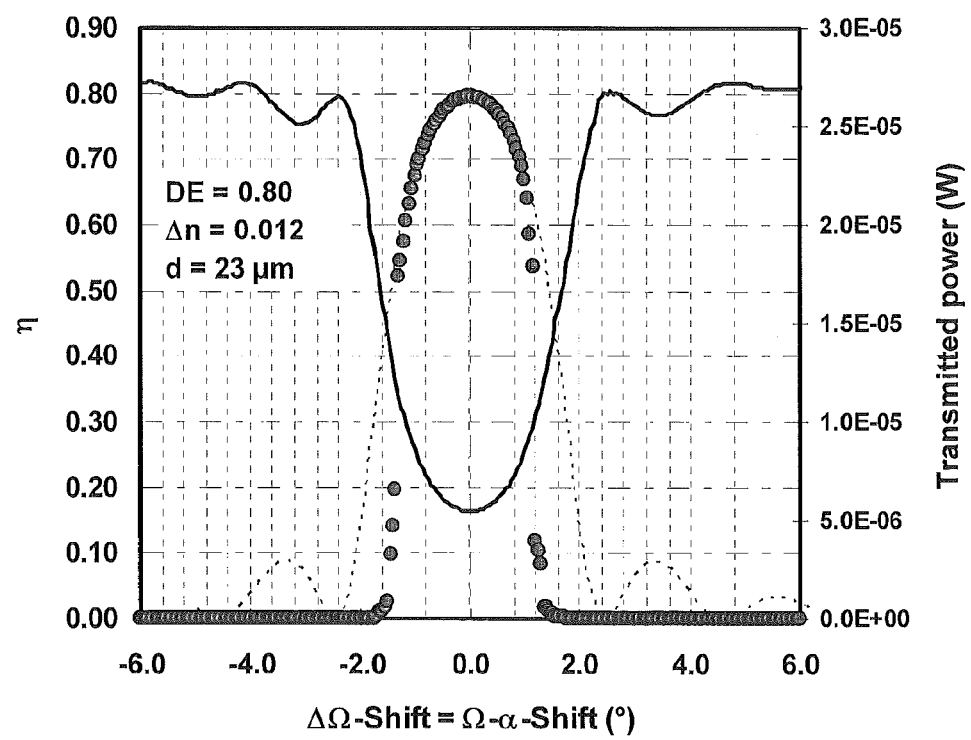
FIG. 2 depicts the plot of the Bragg curve according to Kogelnik (dashed line), of the measured diffraction efficiency (solid circles) and of the transmitted power (black solid line) against the angle detuning $\Delta\Omega$.

The measured data of the diffraction efficiency, the theoretical Bragg curve and the transmitted intensity are, as shown in FIG. 2, plotted against the centred angle of rotation Ω-α shift. Since, owing to the geometric shrinkage and the change in the average refractive index during the photopolymerization, the angle at which DE is measured differs from α, the x axis is centred around this shift. The shift is typically 0° to 2°.

Since DE is known, the shape of the theoretical Bragg curve according to Kogelnik is determined only by the thickness d of the photopolymer layer. An is subsequently corrected via DE for a given thickness d so that measurement and theory of DE always agree. d is now adapted until the angle positions of the first secondary minima of the theoretical Bragg curve agree with the angle positions of the first secondary maxima of the transmitted intensity and additionally the full width at half maximum (FWHM) for the theoretical Bragg curve and the transmitted intensity agree.

Since the direction in which a reflection hologram concomitantly rotates on reconstruction by means of an Ω scan, the detector for the refracted light can detect only a finite angle range, the Bragg curve of broad holograms (small d) is not completely detected in an Ω scan, but only the central region, with suitable detector positioning. That shape of the transmitted intensity which is complementary to the Bragg curve is therefore additionally used for adapting the layer thickness d.

FIG. 2 shows the plot of the Bragg curve η according to Kogelnik (dashed line), of the measured diffraction efficiency (solid circles) and of the transmitted power (black solid line) against the angle detuning ΔΩ. Since, owing to the geometric shrinkage and the change in the average refractive index during the photopolymerization, the angle at which DE is measured differs from α, the x axis is centred around this shift. The shift is typically 0° to 2°.

For a formulation, this procedure was possibly repeated several times for different exposure times t on different media in order to determine the average energy dose of the incident laser beam at which DE reaches the saturation value during writing of the hologram. The average energy dose E is obtained from the powers of the two part-beams collimated with the angles α and β ($P_\alpha$=0.50 mW and $P_\beta$=0.67 mW), the exposure time t and the diameter of the iris diaphragm (0.4 cm), as follows:

$$E(mJ/cm^2) = \frac{2 \cdot \lfloor P_\alpha + P_\beta \rfloor \cdot t(s)}{\pi \cdot 0.4^2 \ cm^2}$$

The powers of the part-beams were adapted so that the same power density is achieved in the medium at the angles α and β used.

General Method for the Production of the Holographic Media for Examples 9-41; 45-50

5.927 g of the above-described polyol 1 prepared were mixed with 2.5 g of the corresponding writing monomer, 0.1 g of CGI 909, 0.01 g of new methylene blue, 0.015 g of glass beads having a size of 20 μm (e.g. from Whitehouse Scientific Ltd, Waverton, Chester, CH3 7PB, United Kingdom) at 60° C. and 0.35 g of N-ethylpyrollidone so that a clear solution was obtained. Thereafter, cooling to 30° C. was effected, 1.098 g of Desmodur® XP 2410 (component A) were added and mixing was effected again. Finally, 0.006 g of Fomrez® UL 28 was added and mixing was effected again briefly. The liquid material obtained was then poured onto a glass plate and covered there with a second glass plate which was kept a distance of 20 μm away by spacers. The curing of the PU formulation takes place under 15 kg weights over several hours (usually overnight). In some cases, the medi were post-cured in light-tight packaging for a further 2 hours at 60° C. The thickness d of the photopolymer layer is 20 μm, based on the diameter of the glass beads used. Since different formulations having different starting viscosity and different curing rate of the matrix do not always lead to identical layer thicknesses d of the photopolymer layer, d is determined separately for each sample from the characteristics of the holograms written.

Table 9 shows the holographic results of the media based on photopolymers according to the invention (Examples 9-41):

| Example # | WM from example | RI of WM | Delta n | Thickness (μm) | Exposure time (s) |
|---|---|---|---|---|---|
| Example 9 | 1a | 1.651 | 0.010 | 25 | 4 |
| Example 10 | 1b | 1.590 | 0.009 | 23 | 2 |
| Example 11 | 1c | 1.593 | 0.007 | 40 | 4 |
| Example 12 | 1d | 1.600 | 0.008 | 28 | 4 |
| Example 13 | 1e | 1.633 | 0.008 | 26 | 4 |
| Example 14 | 1f | 1.580 | 0.007 | 24 | 2 |
| Example 15 | 1g | 1.590 | 0.007 | 22 | 2 |
| Example 16 | 1h | 1.639 | 0.007 | 26 | 4 |
| Example 17 | 1i | 1.588 | 0.006 | 28 | 2 |
| Example 18 | 2a | 1.656 | 0.007 | 22 | 2 |
| Example 19 | 2b | 1.611 | 0.008 | 19 | 4 |
| Example 20 | 2c | 1.625 | 0.009 | 24 | 4 |
| Example 21 | 2d | 1.656 | 0.008 | 27 | 4 |
| Example 22 | 3a | 1.629 | 0.008 | 21 | 2 |
| Example 23 | 3b | 1.600 | 0.009 | 28 | 4 |
| Example 24 | 3c | 1.604 | 0.010 | 32 | 2 |
| Example 25 | 3d | 1.637 | 0.010 | 23 | 4 |
| Example 25 | 4a | 1.609 | 0.008 | 22 | 4 |
| Example 26 | 4b | 1.587 | 0.007 | 18 | 2 |
| Example 27 | 4c | 1.575 | 0.008 | 25 | 2 |
| Example 28 | 4d | 1.599 | 0.006 | 21 | 2 |
| Example 29 | 5a | 1.612 | 0.012 | 23 | 4 |
| Example 30 | 5b | 1.558 | 0.009 | 16 | 4 |
| Example 31 | 5c | 1.569 | 0.008 | 23 | 4 |
| Example 32 | 5d | 1.627 | 0.009 | 33 | 4 |
| Example 33 | 6a | 1.622 | 0.010 | 30 | 2 |
| Example 34 | 6b | 1.585 | 0.009 | 17 | 2 |
| Example 35 | 6c | 1.570 | 0.008 | 19 | 4 |
| Example 36 | 7a | 1.623 | 0.008 | 20 | 2 |
| Example 37 | 7b | 1.593 | 0.007 | 18 | 4 |
| Example 38 | 7c | 1.599 | 0.005 | 18 | 2 |
| Example 39 | 8a | 1.620 | 0.007 | 22 | 4 |
| Example 40 | 8b | 1.603 | 0.007 | 15 | 4 |
| Example 41 | 8c | 1.601 | 0.006 | 26 | 4 |

Example 42

430.2 g of Denacol EX 142 (Nagase-Chemtex, Japan), 129.7 g of acrylic acid, 1.18 g of triphenylphosphine and 0.0056 g of 2,6-di-t-butyl-4-methylphenol were introduced into a three-necked flask with reflux condenser and stirrer. In addition, air was slowly passed through and the temperature was held at 60° C. The mixture was subsequently stirred at 90° C. for 24 hours. A clear liquid having an OH number of 157.8 mg of KOH/g was obtained.

Examples 42a-42d

The following examples were carried out analogously to Example 1a. Details are given in Table 10

TABLE 10

| Example | Raw material 1 product from Example 9 | Raw material 2 isocyanate | Raw material 3 | Reaction time | Product |
|---|---|---|---|---|---|
| 42a | 24.9 g | 5.9 g of HDI | | 24 h | colorless, clear, highly viscous product |
| 42b | 21.3 g | 5.2 g of T80 | | 24 h | colorless, clear, glassy product |
| 42c | 14.2 g | 3.5 g of T100 | 1.8 mg of DBTL | 18 h | colorless, clear, glassy product |
| 42d | 22.2 g | 5.9 g of TIN | 2.8 mg of DBTL | 18 h | colorless, clear, glassy product |

Abbreviations see table 1

Example 43.1

4.7 g of p-phenylphenol, 15.1 g of epibromohydrin, 13.6 g of potassium carbonate and 33.3 g of 2-butanone were introduced into a three-necked flask with reflux condenser and stirrer at 30° C. The mixture was heated to 70° C. and stirred for 16 hours. After filtration, the filtrate was freed from low-boiling components in a rotary evaporator. After addition of 2×30 ml of 2-butanone and redistillation, p-phenylphenol glycidyl ether was obtained as a crystalline solid having a melting range of 96-98° C. $^1$H-NMR (CDCl$_3$, 400 MHz): 2.78 (dd, 1H), 2.90 (t, 1H), 3.36 (m, 1H), 4.02 (dd, 1H), 4.24 (dd, 1H), 7.00 (AA'BB' system, 2H), 7.30 (t, 1H), 7.40 (t, 1H), 7.55 (m, 4H).

Example 43.2

4.6 g of the product from Example 43.1, 1.7 g of acrylic acid, 0.1 mg of 2,6-di-t-butyl-4-methylphenol and 15.0 mg of triphenylphosphine were introduced into a three-necked flask with reflux condenser and stirrer. In addition, air was slowly passed through and the temperature was held at 90° C. The mixture was stirred for 42 h. A clear, colorless, liquid product was obtained which, according to $^1$H-NMR, shows an epoxide conversion of greater than 95%.

Example 43.3

6.3 g of the product from Example 43.2 and 2.0 g of a mixture of 2,4- and 2,6-toluidene diisocyanate (Desmodur T80, Bayer MaterialScience AG, Leverkusen, Germany) and 0.8 mg of dibutyltin dilaurate were introduced into a three-necked flask with reflux condenser and stirrer. In addition, air was slowly passed through and the temperature was held at 60° C. The product was stirred at 60° C. for 15 hours. A clear, colorless, liquid product with NCO=0% was obtained.

Example 44.1

4.7 g of m-phenylphenol, 15.1 g of epibromohydrin, 13.6 g of potassium carbonate and 33.3 g of 2-butanone were introduced into a three-necked flask with reflux condenser and stirrer. In addition, air was slowly passed through and the temperature was held at 70° C., and the mixture was stirred for 15 hours. After filtration, the filtrate was freed from low-boiling components in a rotary evaporator. m-Phenylphenol glycidyl ether was obtained as a clear, liquid product: $^1$H-NMR (CDCl$_3$, 400 MHz): 2.78 (dd, 1H), 2.90 (t, 1H), 3.36 (m, 1H), 4.02 (dd, 1H), 4.24 (dd, 1H), 6.90 (dd, 1H), 7.15 (d, 1H), 7.20 (d, 1H), 7.35 (m, 2H), 7.40 (t, 2H), 7.55 (d, 2H).

Example 44.2

4.0 g of the product from Example 44.1, 1.4 g of acrylic acid, 0.1 mg of 2,6-di-t-butyl-4-methylphenol and 13.0 mg of triphenylphosphine were introduced into a three-necked flask with reflux condenser and stirrer. In addition, air was slowly passed through and the temperature was held at 90° C. The mixture was stirred for 42 h. A clear, colorless, liquid product was obtained. According to $^1$H-NMR, >90% of epoxide had reacted.

Example 44.3

5.4 g of the product from Example 44.2 and 1.7 g of a mixture of 2,4- and 2,6-toluidene diisocyanate (Desmodur T80, Bayer MaterialScience AG, Leverkusen, Germany) and 0.7 mg of dibutyltin dilaurate were introduced into a three-necked flask with reflux condenser and stirrer. In addition, air was slowly passed through and the temperature was held at 60° C. 10 ml of chloroform were then added. The product was stirred at 60° C. for 19 hours. Low-boiling components were removed in a rotary evaporator, giving a clear, glassy product with NCO=0%.

TABLE 11

Holographic performance of the media according to the invention, WM: writing monomer, RI: refractive index (Examples 45-50)

| Example # (s) | SM from Example | RI of the SM | Delta n | Thickness (μm) | Exposure duration |
|---|---|---|---|---|---|
| 45 | 42a | 1.612 | 0.011 | 17 | 4 |
| 46 | 42b | 1.643 | 0.011 | 14 | 2 |
| 47 | 42c | 1.635 | 0.008 | 21 | 2 |
| 48 | 42d | 1.619 | 0.005 | 24 | 1 |
| 49 | 43.3 | 1.645 | 0.011 | 17 | 2 |
| 50 | 44.3 | 1.645 | 0.009 | 17 | 4 |

The photopolymers in the media according to the invention from Examples 9-41 and 45-50 are all optically clear and it is possible to write volume holograms at room temperature exclusively by the action of coherent radiation. As required by the object, it is possible to write visual holograms while dispensing with thermal and/or chemical aftertreatment.

The invention claimed is:

1. A photopolymer composition comprising
   a) an unsaturated glycidyl ether acrylate urethane of formula (1a), formula (1b), or mixtures thereof

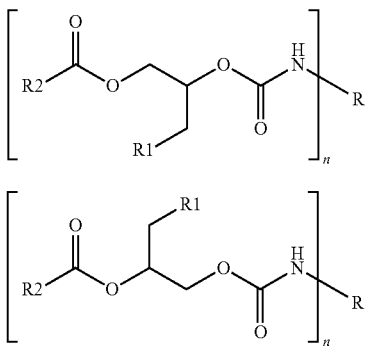

formula 1a formula 1b wherein n is an integer from 2 to 6;

R1 is a mono- or polynuclear organic radical comprising an aromatic group and from 4 to 36 carbon atoms;

R2 is an olefinically unsaturated radical comprising from 3 to 30 carbon atoms; and R is an organic radical derived from an aliphatic or aromatic di- or polyisocyanate and comprises from 2 to 30 carbon atoms;

b) a binder system;

c) a photoinitiator system; and d) optionally, a free radical stabilizer, a catalyst, and/or one or more further additives.

2. The photopolymer composition of claim 1, wherein

R1 is oxyphenyl, oxybromophenyl, oxydibromophenyl, or oxynaphthyl;

R2 is derived from an acid R2-COOH, wherein R2-COOH is selected from the group consisting of acrylic acid, methacrylic acid, 3-acrylyloxypropionic acid, or an adduct of hydroxyethyl and hydroxybutyl acrylate with maleic anhydride; and R is derived from an n-functional isocyanate $R(NCO)_n$, wherein $R(NCO)_n$ is selected from the group consisting of 2,6-hexamethylene diisocyanate, 2,4,4-trimethyl-1,6-hexamethylene diisocyanate, isocyanatomethyl-1,8-octane diisocyanate, tris(p-isocyanatophenyl) thiophosphates, tris(4,4'- and/or 2,4'-) diisocyanatodicyclohexylmethane, 1-isocyanato-3-isocyanatomethyl-3,5,5-trimethylcyclohexane, diisocyanatodicyclohexylmethane 2,4- and/or 2,6-toluidene diisocyanate, and trimers of hexamethylene diisocyanate having an isocyanurate and/or iminooxadiazinetrione structure.

3. The photopolymer composition of claim 1, wherein said unsaturated glycidyl ether acrylate urethane of a) has a refractive index at 405 nm of greater than 1.53.

4. The photopolymer composition of claim 1, wherein said crosslinked binder is a two-component polyurethane system.

5. The photopolymer composition of claim 4, wherein said two-component polyurethane system comprises, as the isocyanate component, oligo- and polyisocyanates of aliphatic diisocyanates comprising an isocyanurate, allophanate, biuret, uretdione, or iminooxadiazinedione structure, and the polyol component comprises polyethylene/polypropylene glycols having a polypropylene content of at least 70% and a functionality of from 1.9 to 2.5 and/or polyester-polyether-polyester block polyols based on polytetrahydrofurans having a number average molecular weight of from 400 to 1400 g/mol and s-caprolactone, wherein said polyester-polyether-polyester block polyols have a number average molecular weight of from 1500 to 4000 g/mol.

6. A process for producing a medium for recording visual holograms, comprising applying the photopolymer composition of claim 1 to a substrate or in a mould and curing said photopolymer composition.

7. The medium for recording visual holograms produced by the process of claim 6.

8. An optical element or image comprising the medium of claim 7.

9. A glycidyl ether acrylate urethane of formula (1a) or (1b)

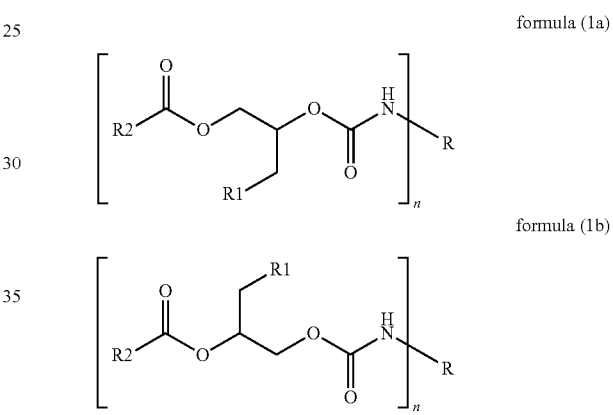

formula (1a)

formula (1b)

wherein n is an integer from 2 to 6;

R1 is a halogen- and/or alkylthio-, and/or arylthio-substituted oxyphenyl ring or is a halogen-, alkyl-, aryl-, alkylthio-, or arylthio-substituted oxynaphthyl, oxyanthracenyl, oxyphenantryl, N-carbazolyl, N-alkylcarbazolzyl, N-phthalimidyl, N-phenothiazinyl, N-alkylphenothiazinyl, or oxytriarylmethyl radical, R2 is an olefinically unsaturated radical comprising from 2 to 30 carbon atoms;

R is an organic radical derived from an aliphatic or aromatic di- or polyisocyanate and comprising from 2 to 30 carbon atoms.

* * * * *